United States Patent
Bristol

(10) Patent No.: US 6,825,988 B2
(45) Date of Patent: Nov. 30, 2004

(54) ETCHED SILICON DIFFRACTION GRATINGS FOR USE AS EUV SPECTRAL PURITY FILTERS

(75) Inventor: Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 10/237,245

(22) Filed: Sep. 4, 2002

(65) Prior Publication Data

US 2004/0051954 A1 Mar. 18, 2004

(51) Int. Cl.⁷ .............................................. G02B 27/14
(52) U.S. Cl. ...................... 359/634; 359/571; 359/350
(58) Field of Search ................................ 359/634, 569, 359/571, 350, 361

(56) References Cited

U.S. PATENT DOCUMENTS

| 6,262,845 B1 * | 7/2001 | Sweatt ........................ 359/571 |
| 6,289,145 B1 * | 9/2001 | Solgaard et al. ............... 385/17 |
| 2001/0003035 A1 * | 6/2001 | Ozarski et al. ............. 359/571 |
| 2002/0097385 A1 * | 7/2002 | Van Elp et al. ............... 355/67 |
| 2002/0127497 A1 * | 9/2002 | Brown et al. ................ 430/321 |

OTHER PUBLICATIONS

Franke, et al. "Super-smooth x-ray reflection grating fabrication", Journal of Vacuum Sciences & Technology B, (Microelectronics and Nanometer Structure/Processing, Measurement, and Phenomena), vol. 15, No. 6, pp. 2940–2945, Nov./Dec. 1997.

Bristol, et al., "Silicon Diffraction Gratings for Use in the Far-and Extreme–Ultraviolet", SPIE, vol. 3114, pp. 580–585, 1997.

* cited by examiner

*Primary Examiner*—Huy Mai
(74) *Attorney, Agent, or Firm*—Fish & Richardson P.C.

(57) ABSTRACT

An extreme ultraviolet (EUV) lithography system may include a spectral purity filter including diffractive gratings. The diffractive gratings may be formed in a silicon substrate using anisotropic etching techniques to produce smooth, flat facets defined by (111) crystallographic planes.

25 Claims, 5 Drawing Sheets

ETCHED SILICON DIFFRACTION GRATINGS FOR USE AS EUV SPECTRAL PURITY FILTERS

BACKGROUND

The progressive reduction in feature size in integrated circuits (ICs) is driven in part by advances in lithography. ICs may be created by alternately etching material away from a chip and depositing material on the chip. Each layer of materials etched from the chip may be defined by a lithographic process in which light shines through a mask, exposing a photosensitive material, e.g., a photoresist.

The ability to focus the light used in lithography, and hence to produce increasingly smaller line widths in ICs, may depend on the wavelength of light used. Current techniques may use light having a wavelength of about 193 nm. The use of "soft" x-rays (wavelength range of $\lambda \approx 10$ to 20 nm) in lithography is being explored to achieve smaller desired feature sizes. Soft x-ray radiation may also be referred to as extreme ultraviolet (EUV) radiation.

A challenge in EUV lithography is to eliminate all but a narrow desired range of wavelengths from the light used to expose the wafer (typically 13.4 nm with a 2% bandwidth). The multilayer coatings of the mirrors naturally perform this task in the neighborhood of the exposure wavelength, as their reflectivity rapidly falls to nearly zero away from this wavelength. However, much longer wavelengths may still be reflected by the multilayers. In particular, infra-red (IR) and deep ultraviolet (DUV) wavelengths may still reflect off the mirrors. Such wavelengths are eliminated by use of a Spectral Purity Filter (SPF). These can be made of, for example, a thin-film which transmits EUV and absorbs unwanted wavelengths. Another approach is to use a diffraction grating to spread out the wavelengths, and then spatially block non-EUV wavelengths. Critical performance criteria for SPFs are efficiency (% EUV transmitted) and the ability to cool the SPF (absorbed radiation will heat the element). For example, film-type (transmissive) spectral purity filters may absorb 50% or more of incident EUV radiation.

DETAILED DESCRIPTION

Figure 1:
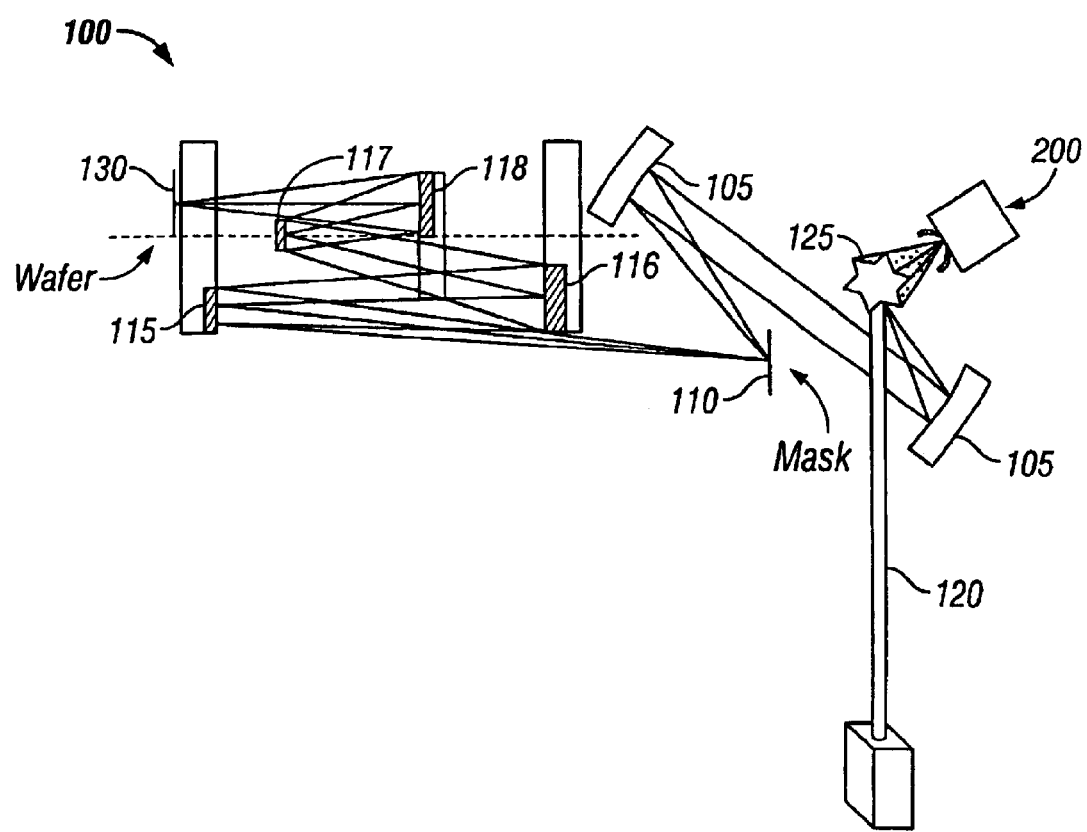
FIG. 1 is a block diagram of an Extreme Ultraviolet (EUV) lithography system according to an embodiment.

FIG. 1 illustrates an example of an Extreme Ultraviolet (EUV) lithography system 100 according to an embodiment. EUV lithography is a projection lithography technique which may use a reduction optical system and illumination in the soft X-ray spectrum (wavelengths in the range of about 10 nm to 20 nm). The system 100 may include a source of Extreme-Ultraviolet light, condenser optics 105, a reticle mask 110, and an optical system including mirrors (M1–M4) 115–118. The mirrors in the system are made to be reflective to EUV light of a particular wavelength (typically 13.4 nm) by means of multilayer coatings (typically of Mo and Si). As EUV is strongly absorbed by materials and gases, the lithography process is carried out in a vacuum, and a reflective, rather than transmissive, reticle mask 110 may be used.

The source of soft X-rays may be a compact high-average-power, high-repetition-rate laser 120 which impacts a target material 125 to produce broad band radiation with significant EUV emission. The target material may be, for example, a noble gas, such as Xenon (Xe), condensed into liquid or solid form. The target material may convert a portion of the laser energy into a continuum of radiation peaked in the EUV. Other approaches may also be taken to produce the EUV plasma, such as driving an electrical discharge through the noble gas.

The condenser optics 105 may collect EUV light from the source and condition the light to uniformly illuminate the mask 110 and properly fill an entrance pupil of the camera.

The radiation from the condenser 105 may be directed to the mask 110. The mask may include reflecting and absorbing regions. The reflected EUV radiation from the mask 110 may carry an IC pattern on the mask 110 to a photoresist layer on a wafer 130 via the optical system including multilayer mirrors M1–M4. The entire reticle may be exposed onto the wafer 130 by synchronously scanning the mask and the wafer, e.g., by a step-and-scan exposure.

The EUV lithography system 100 may operate at a wavelength of 13.4 nm. A spectral purity filter may be used to filter out radiation that does not have the desired wavelength. Such a filter may be composed of a diffraction gratings which diffracts most of the out-of-band radiation out of the beam.

Figure 2:
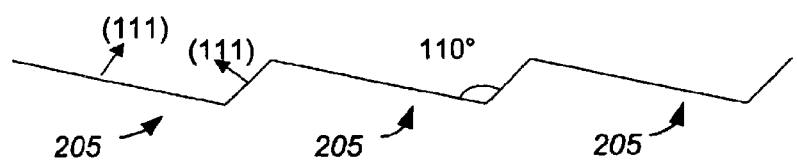
FIG. 2 illustrates a grating facet profile of a spectral purity filter according to an embodiment.

FIG. 2 illustrates a grating facet profile 200 of a diffraction grating in a silicon substrate for use as a spectral purity filter in the system 100. The groove facets may be defined by a set of crystallographic planes in the material, and hence provide nearly atomically smooth and flat reflective surfaces. Flat facets may have advantages in diffraction efficiency and may be easier to coat with a reflective material. The grating facets 205 may include intersecting (111) planes in the silicon crystal structure. The trough angle may be about 110 degrees or about 70 degrees, depending on the original crystallographic orientation in the silicon wafer. Unlike a transmissive (e.g., film) spectral purity filter, a defractive spectral purity filter such as that shown in FIG. 2 may separate out-of-band radiation by reflecting light in different directions based on wavelength. Light with the desired wavelength may be reflected in a particular direction and passed into the system, e.g., through a window, and the rest of the radiation may be blocked.

Figure 3:
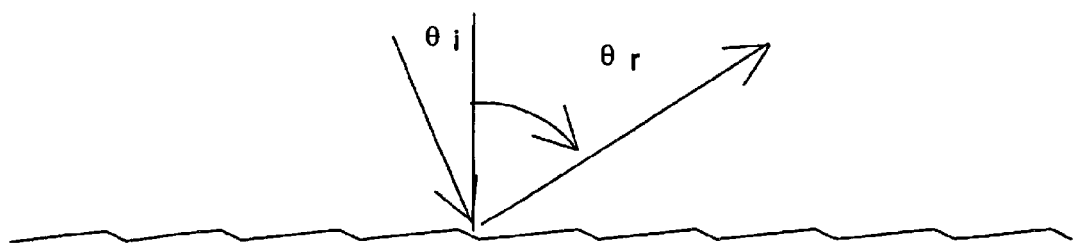
FIG. 3 illustrates a reflection of incident light from diffraction gratings.
Figure 4:
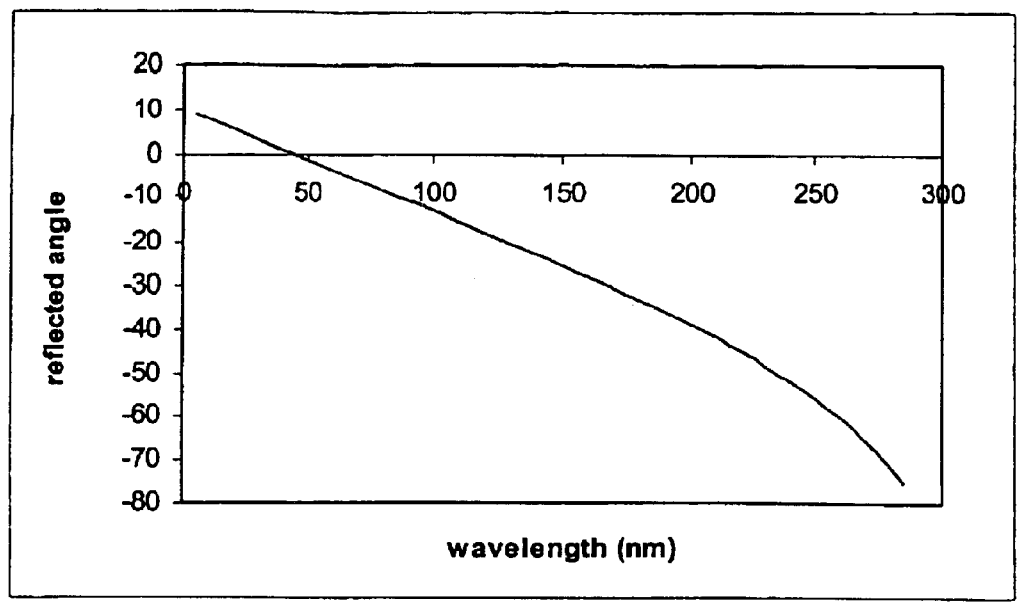
FIG. 4 is a graph showing the angles of reflection of different wavelengths of light from diffraction gratings in a spectral purity filter according to an embodiment.
Figure 7:
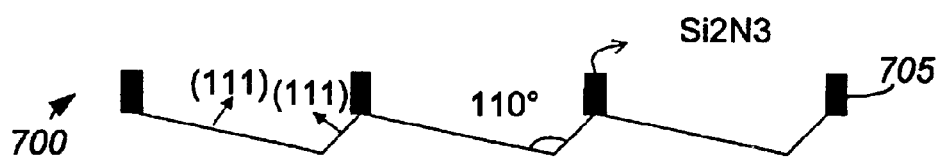
FIG. 7 is a cross section of diffraction gratings in a silicon substrate after etching and before removal of the mask during fabrication.

The angles at which the various wavelengths are sent may be calculated using the equation $\sin(\theta_r) = m \ast \lambda/d + \sin(\theta_i)$, where each angle is measured from the normal, as shown in FIG. 3. FIG. 4 shows the directions at which different wavelengths may be reflected for an exemplary diffractive spectral purity filter with the representative values of m=−1 (first inside order), d=250 nm (4000 grooves/mm) and $\theta_i$=10 degrees with respect to normal. The angular dispersion of the spectrum by the exemplary diffractive spectral purity filter may be seen in the graph for the m=−1 order from 5 to 285 nm. Higher wavelengths (and some energy in the 5 nm to 200 nm range) may be scattered or simply reflected to 80 degrees. For gratings properly blazed (facets tilted) for the m=−1 (inside) order for λ=13.4 nm, over 90% of the desired EUV energy may be sent to 6.9 degrees from the normal. A window placed at this angle may be used to capture the 13.4 nm EUV radiation but avoid the vast of majority of the other wavelengths, which may either be reflected at 10 degrees, diffracted to other angles, or scattered.

Figure 5:
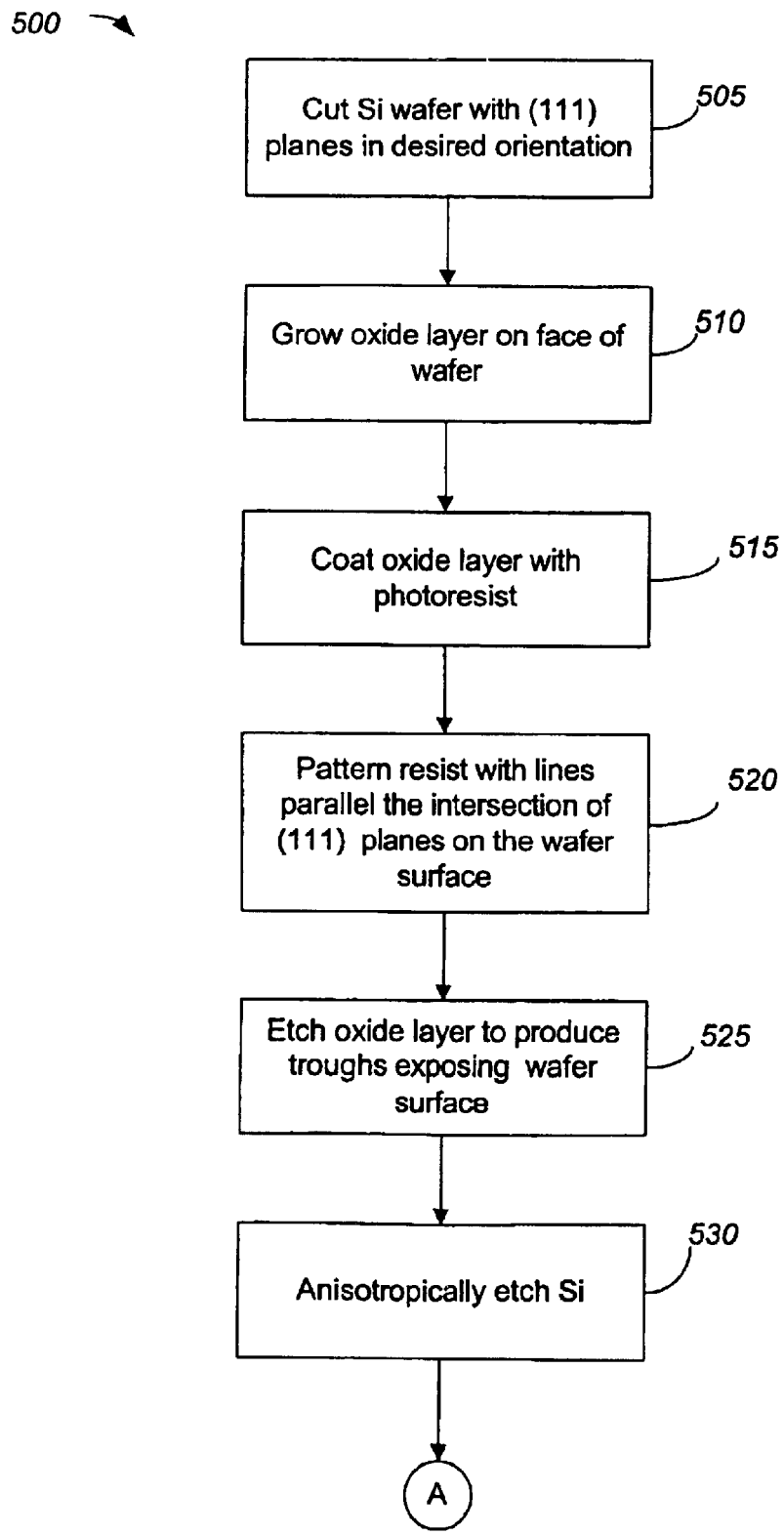
FIGS. 5 and 6 show a flowchart describing a process for fabricating a spectral purity filter according to an embodiment.
Figure 6:
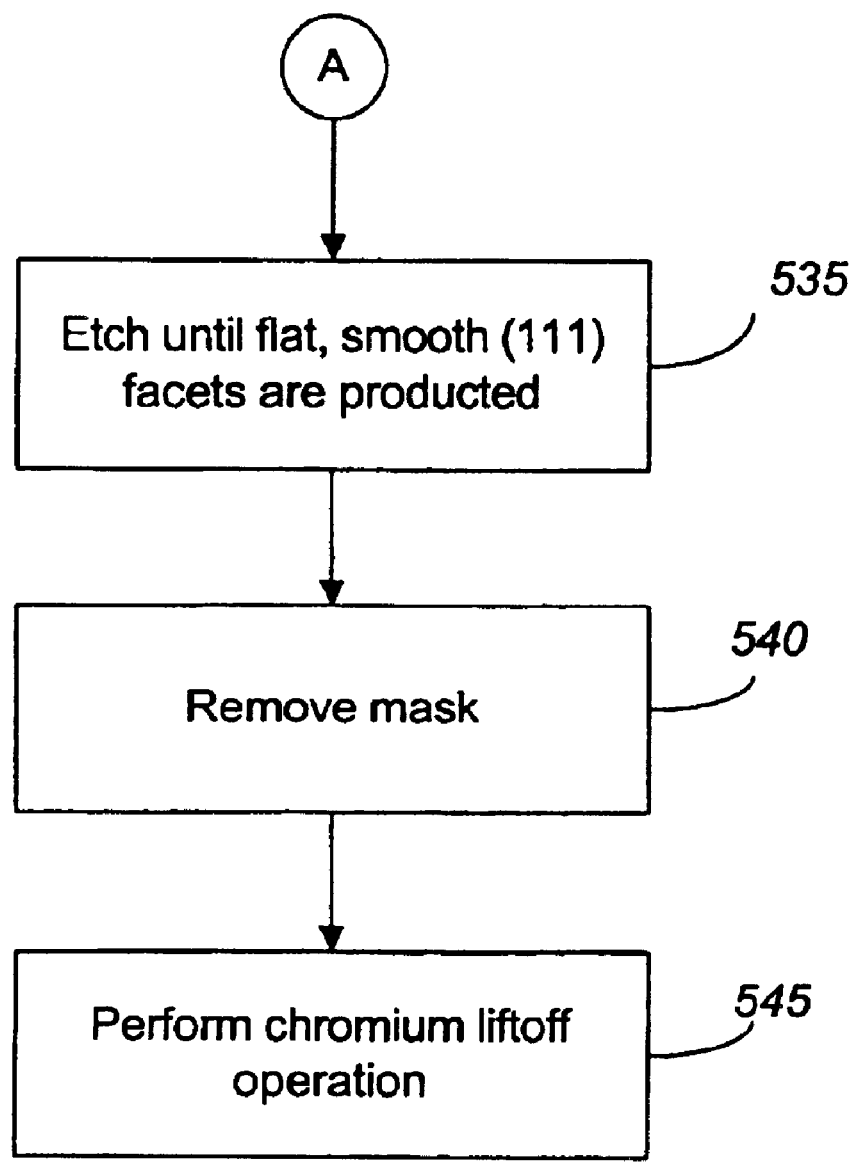

The reflective surfaces of the gratings need to be very smooth and flat to avoid scattering the 13.4 nm light. FIGS. 5 and 6 show a flowchart describing a simplified process 500 for fabricating a silicon diffractive spectral purity filter with grating facet surfaces having nearly atomically smooth and flat surfaces.

A silicon wafer may be cut from a crystalline silicon ingot so that the (111) planes in the wafer are oriented in a desired direction (block 505). The cut of the wafer, e.g., the orientation of the (111) planes, may determine the blaze angle of the diffraction gratings. (block 510).

The wafer may be coated with a layer of positive photoresist material 700 (block 515). The resist 700 may be exposed and removed in a pattern of lines 705 parallel to the intersection of (111) planes with the surface of the wafer (block 520). The lines 705 may be defined by, for example, lithography, electron beam exposure, or interferometric exposure with laser beams. An exemplary mask may include lines 605 separated by about 250 nm to produce 4000 grooves/mm.

The nitride layer may be etched vertically in areas unprotected by the photoresist mask, leaving parallel troughs of exposed silicon (block 525). The wafer may then be placed in a potassium hydroxide (KOH) bath to anisotropically etch the exposed silicon (block 530). KOH etches into teethe <111> direction much more slowly than in other directions, resulting in sharp, self-limiting V-shaped grooves with extremely smooth (111) facets (block 535) (FIG. 6). The potassium hydroxide may etch into the silicon and then naturally terminate at the intersecting (111) planes, resulting in a grating facet profile such as that shown in FIG. 2.

The photoresist and other layers not explicitly mentioned are then cleaned off the wafer, leaving only the nitride mask and etched silicon(block 540). Si ridges remaining under the Si3N4 mask (block 545) may then be removed by depositing a thin layer of Cr, wet-etching in HF to remove the Si3N4, and finally using a CF4 reactive ion etch to remove the uncovered ridges.

The anisotropic etching process may produce very smooth and flat grating facets. A wafer with a grating facet profile having surfaces with a surface roughness of less than about 0.4 nm rms have been produced using this. The flat facets may then be coated with a reflective multilayer, such as silicon/molybdenum (Si/Mo) multilayers.

Computer modeling of a diffraction grating with 250 nm wide sawtooth facets, blazed at 1.6 degrees and with a 67% reflective multilayer coating indicate that such a grating could send about 65% of incident 13.4 nm light into the m=−1 (inside) order at 6.9 degrees. Actual efficiencies may be lower due to, for example, scatter from surface roughness and variations in the facet profile.

Mirrors in the system 100 may be about 67% efficient in reflecting the EUV radiation. A silicon diffraction grating for use as a spectral purity filter may be incorporated into a mirror already in the system, with an overall improvement in efficiency as compared to the grating being a separate element.

The exemplary fabrication process 500 may be relatively inexpensive, since it uses a single lithographic exposure and a few simple process steps. Relatively inexpensive silicon components including diffraction gratings fabricated using the process 500 may be placed in the harsh environment typically found near the source, where the gratings could be replaced often. Furthermore, this placement may separate the EUV radiation from the other wavelengths early on in the optical path, which may decrease the thermal loading of delicate multilayer mirrors further downstream in the system 100.

The diffraction gratings 205 may be etched in a silicon substrate which may be bonded to a thicker substrate. The thicker substrate may be curved, in which case, the process 500 may be modified to accommodate the curvature in the diffraction gratings. The diffraction grating may also be etched into the thick substrate. Cooling channels may also be provided in such a thick silicon component to aid in cooling the system 100.

A number of embodiments have been described. Nevertheless, it will be understood that various modifications may be made without departing from the spirit and scope of the invention. For example, blocks in the flowchart may be skipped or performed out of order and still produce desirable results. Accordingly, other embodiments are within the scope of the following claims.

What is claimed is:

1. A method comprising:
   directing extreme ultraviolet light to a diffraction grating in a silicon substrate, the diffraction grating including facets defined by crystallographic planes;
   separating a predetermined range of wavelengths from the extreme ultraviolet light; and
   directing the predetermined range of extreme ultraviolet light to a mask in a lithography system.

2. The method of claim 1, where the extreme ultraviolet light includes wavelengths in a range from about 10 nm to about 20 nm.

3. The method of claim 1, wherein the predetermined range of extreme ultraviolet light comprises wavelengths in a range from about 13 nm and about 14 nm.

4. The method of claim 1, wherein the predetermined range of extreme ultraviolet light comprises a wavelength of about 13.4 nm.

5. A method comprising:
   providing a wafer of silicon including (111) crystallographic planes;
   forming a mask on the wafer defining a predetermined pattern of diffraction gratings;
   anisotropically etching the silicon to produce facets defined by intersecting (111) crystallographic planes; and
   using the grating as a spectral purity filter adapted to be incorporated into an extreme ultraviolet lithography system.

6. The method of claim 5, further comprising selecting an orientation of the (111) crystallographic planes in the wafer corresponding to a predetermined blaze angle.

7. The method of claim 6, wherein said selecting comprises selecting an orientation corresponding to a predetermined blaze angle for diffractive gratings operative to separate wavelengths in a range of about 10 nm to about 20 nm from extreme ultraviolet light.

8. The method of claim 6, said selecting comprises selecting an orientation corresponding to a predetermined blaze angle for diffractive gratings operative to separate wavelengths in a range of about 13 nm to about 14 nm from broad-band light.

9. The method of claim 6, said selecting comprises selecting an orientation corresponding to a predetermined blaze angle for diffractive gratings operative to separate a wavelength of about 13.4 nm from broad-band light.

10. The method of claim 5, wherein said etching comprises etching the wafer to produce facet surfaces having a surface roughness of less than about 0.4 nm (root mean square).

11. The method of claim 5, wherein the facets have facet surfaces, and further comprising:
coating the facet surfaces with a reflective multilayer.

12. Apparatus comprising:

a silicon substrate adapted to be incorporated in an extreme ultraviolet lithography system, the silicon substrate including a diffractive grating defined by intersecting (111) crystallographic planes and having a blaze angle operative to separate a predetermined range of wavelengths from incident broad-band light.

13. The apparatus of claim 12, wherein the blaze angle is operative to separate wavelengths in a range of about 10 nm to about 20 nm from broad-band light.

14. The apparatus of claim 12, wherein the blaze angle is operative to separate wavelengths in a range of about 13 nm to about 14 nm from broad-band light.

15. The apparatus of claim 12, wherein the blaze angle is operative to separate a wavelengths of about 13.4 nm from broad-band light.

16. The apparatus of claim 12, further comprising a plurality of reflective multilayers.

17. The apparatus of claim 12, further comprising a plurality of cooling channels in the silicon substrate.

18. Apparatus of claim 12, further comprising:

a mirror adapted for use in an optical system of a extreme ultraviolet lithography system, said mirror including said silicon substrate.

19. A system comprising:

a source of extreme ultraviolet light;

a plurality of mirrors operative to direct filtered extreme ultraviolet light to a mask; and a spectral purity filter, said filter including a plurality of diffractive gratings in a silicon substrate, each of said diffractive gratings being defined by intersecting crystallographic planes in the silicon substrate.

20. The system of claim 19, further comprising a mirror including said filter.

21. The system of claim 19, further comprising a reflective multilayer structure covering said diffractive gratings.

22. The system of claim 19, wherein each of a plurality of diffractive gratings has a blaze angle operative to separate a predetermined range of EUV wavelengths from incident broad-band light.

23. The system of claim 22, wherein the blaze angle is operative to separate wavelengths in a range of about 10 nm to about 20 nm from broad-band light.

24. The system of claim 22, wherein the blaze angle is operative to separate wavelengths in a range of about 13 nm to about 14 nm from broad-band light.

25. The system of claim 22, wherein the blaze angle is operative to separate a wavelengths of about 13.4 nm from broad-band light.

* * * * *